United States Patent
Nunn et al.

(10) Patent No.: US 9,837,188 B2
(45) Date of Patent: Dec. 5, 2017

(54) DIFFERENTIAL RETURN LOSS SUPPORTING HIGH SPEED BUS INTERFACES

(71) Applicant: NXP B.V., Eindhoven (NL)

(72) Inventors: Wayne A. Nunn, Hidden Valley Lake, CA (US); Joe E. Schulze, Chandler, AZ (US); Jim R. Spehar, Chandler, AZ (US)

(73) Assignee: NXP B.V., Eindhoven (NL)

( * ) Notice: Subject to any disclaimer, the term of this patent is extended or adjusted under 35 U.S.C. 154(b) by 728 days.

(21) Appl. No.: 13/827,070

(22) Filed: Mar. 14, 2013

(65) Prior Publication Data

US 2014/0009001 A1    Jan. 9, 2014

Related U.S. Application Data

(60) Provisional application No. 61/668,527, filed on Jul. 6, 2012.

(51) Int. Cl.
*H01L 23/495* (2006.01)
*H01B 11/00* (2006.01)
(Continued)

(52) U.S. Cl.
CPC ............ *H01B 11/002* (2013.01); *H01L 23/66* (2013.01); *H01L 24/49* (2013.01); *H01L 23/495* (2013.01); *H01L 24/45* (2013.01); *H01L 2223/6611* (2013.01); *H01L 2223/6638* (2013.01); *H01L 2224/45015* (2013.01); *H01L 2224/45144* (2013.01); *H01L 2224/48465* (2013.01); *H01L 2224/49* (2013.01); *H01L 2224/73265* (2013.01); *H01L 2924/00014* (2013.01); *H01L 2924/3011* (2013.01); *H01L 2924/30107* (2013.01)

(58) Field of Classification Search
CPC .......... H01L 2924/3011; H01L 23/495; H01K 2924/30107
See application file for complete search history.

(56) References Cited

U.S. PATENT DOCUMENTS 5,500,589 A * 3/1996 Sumcad ................. G01R 33/09
                                                                324/202
5,610,417 A * 3/1997 Doi .............................. 257/202
(Continued)

OTHER PUBLICATIONS

Manuel reta-hernandez, "transmission line parameters," 2006, Taylor & Francis Group.*
(Continued)

*Primary Examiner* — Thienvu Tran
*Assistant Examiner* — Pinping Sun

(57) ABSTRACT

Various aspects of the present disclosure are directed toward methods and apparatus that include a lead frame with a fixed external pin pitch. A differential signal path is provided that is characterized by bond-pad pitch range, wire length and wire diameter. The differential signal path carries signals in a frequency range between 5 GHz and 16.1 GHz with less than about 25 dB differential return loss (DDRL). Further, the signals are processed at a signal-processing node that is electrically coupled to the differential signal path by using the differential signal path to carry signals in a frequency range between 5 GHz and about 16.1 GHz.

17 Claims, 5 Drawing Sheets

(51) Int. Cl.
*H01L 23/66* (2006.01)
*H01L 23/00* (2006.01)

(56) References Cited

U.S. PATENT DOCUMENTS

| | | | | |
|---|---|---|---|---|
| 6,065,079 | A * | 5/2000 | Dupuy | 710/305 |
| 6,464,529 | B1 * | 10/2002 | Jensen | H01R 13/6464 |
| | | | | 439/405 |
| 6,538,336 | B1 * | 3/2003 | Secker et al. | 257/786 |
| 7,002,249 | B2 * | 2/2006 | Duffy et al. | 257/728 |
| 7,091,791 | B1 * | 8/2006 | Terrovitis | H03F 3/04 |
| | | | | 330/301 |
| 7,986,047 | B2 * | 7/2011 | Lee et al. | 257/784 |
| 8,143,108 | B2 * | 3/2012 | Pendse | 438/125 |
| 8,303,315 | B2 | 11/2012 | Lee | |
| 8,476,747 | B2 * | 7/2013 | Lee | H01L 23/49541 |
| | | | | 257/676 |
| 8,482,114 | B2 * | 7/2013 | Spehar | H01L 23/66 |
| | | | | 257/693 |
| 8,664,946 | B2 * | 3/2014 | Hesen | G01R 33/09 |
| | | | | 324/174 |
| 2002/0084107 | A1 * | 7/2002 | Chang | H01L 23/49838 |
| | | | | 174/262 |
| 2008/0311797 | A1 * | 12/2008 | Aekins | H01R 13/41 |
| | | | | 439/676 |
| 2009/0250804 | A1 * | 10/2009 | Kaal | H01L 23/49541 |
| | | | | 257/692 |
| 2010/0193925 | A1 * | 8/2010 | Cheng | H01L 23/49541 |
| | | | | 257/676 |
| 2010/0200973 | A1 * | 8/2010 | Schravendeel | H01L 23/49503 |
| | | | | 257/676 |
| 2011/0057302 | A1 * | 3/2011 | Spehar | H01L 23/66 |
| | | | | 257/693 |
| 2011/0070751 | A1 * | 3/2011 | Lee | 439/83 |
| 2012/0112784 | A1 * | 5/2012 | Masuda | G01R 31/002 |
| | | | | 324/762.03 |
| 2013/0012067 | A1 | 1/2013 | Lee | |

OTHER PUBLICATIONS

Baghzouz"EE 340, transmission line",spring 2012.*
INTEL, INTEL Thunderbolt Specification, "Thunderbolt™ Technology The Fastest Connection to your PC," INTEL Corporation, US, 2012.

* cited by examiner

DIFFERENTIAL RETURN LOSS SUPPORTING HIGH SPEED BUS INTERFACES

High speed bus interfaces are useful for connecting peripheral devices to a computer. Examples of the high speed bus interfaces are found in a variety of systems, such as Thunderbolt™ as described by Intel Corporation and Apple Inc. Such bus interfaces, for example, can support two 10 Gbits/s bi-directional channels. For further information regarding this and related highs-speed bus interfaces, reference may be made to Thunderbolt™Technology: Technology Brief (www.intel.com).

Differential return loss (DDRL) is a key parameter for ensuring good signal integrity in the high speed channel. The use of printed circuit boards (PCB) presents signal integrity issues that contribute to poor performance attributable to DDRL. Cable connectors, PCB physical design technique(s), PCB routing topologies (e.g., signal trace bends and vias), and discrete series components all add impedance discontinuities that degrade differential return loss in the high speed channel. These performance impairments present issues in DDRL-related performance.

Various example embodiments are directed toward methods and apparatus for improved differential return loss supporting high speed bus interfaces and their implementation.

An example embodiment includes a lead frame with a fixed external pin pitch. Additionally, such an embodiment also includes a signal interface circuit that provides a differential signal path that is characterized by bond-pad pitch range, wire length, and wire diameter. The differential signal path carries signals in a frequency range from 5 GHz to as high as 16.1 GHz providing significant and unexpected realizations as evidenced by less than about 25 dB differential return loss (DDRL). Further, the example embodiment includes a signal-communication circuit for processing of signals by communicating the signals to or from a signal-processing node that is electrically coupled to the differential signal path by using the differential signal path to carry signals in a frequency range between 5 GHz and about 16 GHz.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
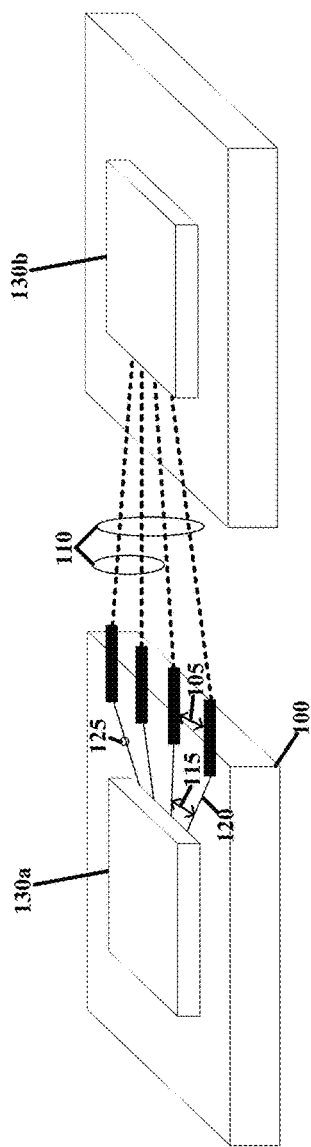
FIG. 1 shows an example implementation of a lead frame with differential signal path, consistent with various aspects of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatus and methods directed to mitigation of differential return loss (DDRL) due to high impedance (e.g., capacitance) in a silicon device or integrated circuit package, particularly where an integrated circuit package would provide signal fan-out for off-chip interfacing as needed for external nodes. While not necessarily so limited, various aspects may be appreciated through a discussion of examples using this context.

Various example embodiments are directed to methods and apparatus including a lead frame with a fixed external pad pitch used in such signal interface circuitry. Aspects of the methods and apparatus disclosed herein are particularly advantageous for signal interface circuit a differential signal path provide by signal interface circuitry which can be defined by specifying bond-pad pitch range, wire length and wire diameter. In more specific embodiments consistent therewith, the signal interface circuitry supports a differential signal path for carrying signals in a frequency range between 5 GHz and 16 GHz, with less than about 25 dB DDRL. Additionally, the methods and apparatus, consistent with various aspects of the present disclosure, include processing signals, by a signal-communication circuit, by communicating the signals to or from a signal-processing node by using the differential signal path to carry signals in a frequency range between 5 GHz and about 16 GHz. The signal-processing node is electrically coupled to the differential signal path.

In certain embodiments of the methods and apparatus, the bond-pad pitch range is between 60 μm and 180 μm. Further, in certain embodiments, the fixed external pin pitch is between 90 μm and 180 μm. Additionally, the wire length is limited, for example, characterized as being less than about three-six centimeters, and in certain applications, much less than three centimeters. The wire diameter, in certain embodiments of the methods and apparatus of the present disclosure, include a wire diameter that is between 15 μm and 25 μm. Further, in certain embodiments of the present disclosure, the differential signal path is characterized by a bond-pad pitch range that is approximately 120 μm, a wire length that is approximately three centimeters, and a wire diameter that is 18 μm. In certain more specific embodiments, the wire length can be less than three centimeters (e.g., 1-2 centimeters or less). The signal interface circuitry, in certain embodiments, supports a differential signal path that carries signals in a frequency range that is greater than 5 GHz and less than 18 GHz. In other embodiments, the signal interface circuitry supports a differential signal path for a frequency range for signals between 10 GHz and 16 GHz. In yet other more specific embodiments, the signal interface circuitry supports signals in a frequency range as high as approximately 16.1 GHz.

Additionally, various embodiments of the methods and apparatus of the present disclosure include a differential signal path that decreases inductive coupling, which thereby increases inductance of the lead frame.

FIG. 1 shows an example implementation of circuitry including a lead frame for providing a differential signal path, consistent with various aspects of the present disclosure. In FIG. 1, a lead frame 100 is shown with a fixed external pad pitch denoted as 105. Also shown in FIG. 1 is a differential signal path(s) 110 that is characterized by a specific bond-pad pitch range 115, wire length 120 and wire diameter 125. The differential signal path 110 carries signals in a frequency range between 5 GHz and 16 GHz with less than about 25 dB differential return loss (DDRL). The configuration shown in FIG. 1 includes a four lead configuration, which is shown as an example configuration. Such embodiments of the present disclosure are useful for many configurations of leads including, for example, QFN (quad-flat no-leads); QFN-TEP (quad flat no-lead package with top-exposed pad); DFN (dual-flat no-leads); dual in-line packages (DIP); TDFN (thin dual flat no-lead package); UTDFN (ultra-thin dual flat no-lead package); Micro lead-frame packages (MLP); XDFN (extremely thin dual flat no-lead package); TQFN (thin quad flat no-lead package); LLP (leadless leadframe package); (LPCC) leadless plastic chip carrier; MLF (micro-leadframe); MLPD (micro-leadframe package dual); MLPM (micro-leadframe package micro); MLPQ (micro-leadframe package quad); DRMLF (dual-row micro-leadframe package); and VQFN (very thin quad flat no-lead).

Additionally, FIG. 1 shows a signal-processing nodes 130a and 130b at which processing of signals occurs by communicating the signals to or from the nodes 130a and 130b by using the differential signal path 110 to carry signals in a frequency range between 5 GHz and about 16 GHz. The signal-processing nodes 130a and 130b are electrically coupled to the differential signal path 110. Additionally, the signal-processing nodes 130a and 130b are present at a chip or die, which includes signal interface circuitry for processing signals by communicating the signals to (e.g., signal-driving circuits) or from (e.g., signal-receiving circuits) a signal-processing node that is electrically coupled to the differential signal path and by using the differential signal path to carry signals in a designated frequency range. In certain embodiments, the signal-processing nodes 130a and 130b are CPUs (including or supported by logic and signal transceiver circuits), and the differential signal path 110 is characterized by a bond-pad pitch range 115 that is approximately 120 µm, a wire length 120 that is approximately three centimeters, and a wire diameter 125 that is 18 µm. The differential signal path 110, in certain embodiments, carries signals in a frequency range that is greater than 5 GHz and less than 18 GHz, and in other embodiments, the frequency range is greater than 10 GHz and less than 16 GHz. Additionally, in certain embodiments, the differential signal path 110 carries signals in a frequency range of approximately 16.1 GHz.

In certain embodiments of the arrangement shown in FIG. 1, the bond-pad pitch range 115 is between 60 µm and 180 µm. Additionally, the fixed external pad pitch 105 can be between 90 µm and 180 µm. The wire length 120 of the arrangement shown in FIG. 1 is depicted as being less than approximately three centimeters, however, the wire length can also be much less than three centimeters. In certain embodiments, the wire diameter 125 is between 15 µm and 25 µm. Additionally, the differential signal path 110 can decrease inductive coupling, thereby increasing inductance of the lead frame 100.

Figure 2:
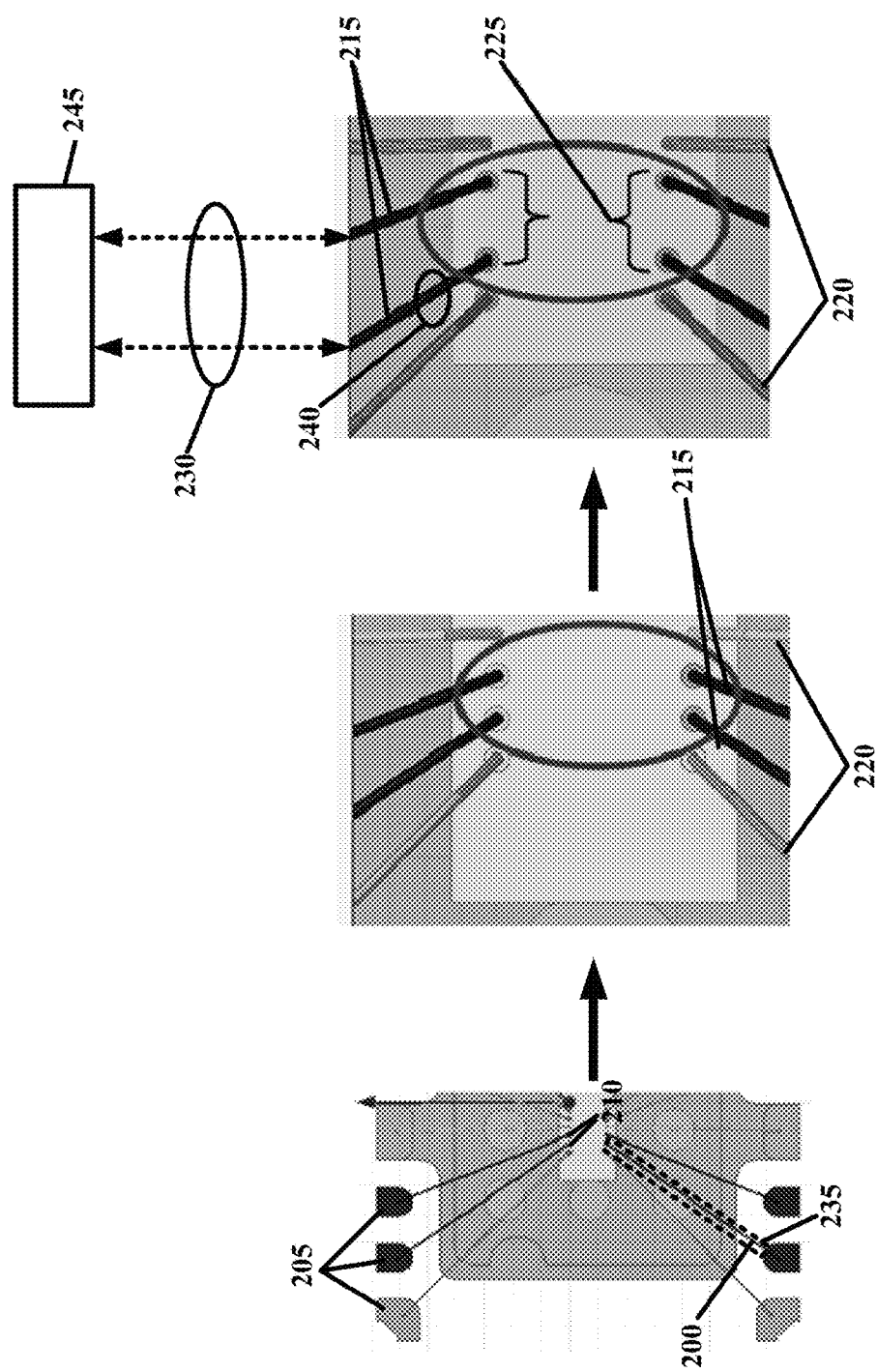
FIG. 2 shows an example partially integrated-package, consistent with various aspects of the present disclosure.

FIG. 2 shows an example partially integrated-package, consistent with various aspects of the present disclosure. FIG. 2 shows a close-up of bond wire 200 configurations utilizing 18 µm diameter wires. Each bond wire 200 is attached at an external pin 205 and to an internal bond-pad 210. The middle portion of FIG. 2 shows a specific configuration of bond wires 215 used in a thunderbolt configuration as opposed other bond wires 220. Various aspects of the bond wires 215 and the configuration thereof can be adjusted, such as the bond-pad pitch range 225, as is shown in the right portion of FIG. 2. Additionally, as shown in the right portion of FIG. 2, when arranged with a signal interface circuit as in FIG. 1, a differential signal path 230 (characterized by the bond-pad pitch range 225, wire length 235, and wire diameter 240) is provided to the arrangement. For such embodiments, the differential signal path 230 carries signals in a frequency range between 5 GHz and 16 GHz (and in some instances up to 18 GHz) with less than about 25 dB differential return loss (DDRL). At a signal-processing node 245 that is electrically coupled to the differential signal path 230, processing of signals occurs by communicating the signals to or from the signal processing node 245 by using the differential signal path 230 to carry signals in a frequency range between 5 GHz and 16 GHz.

Figure 3:
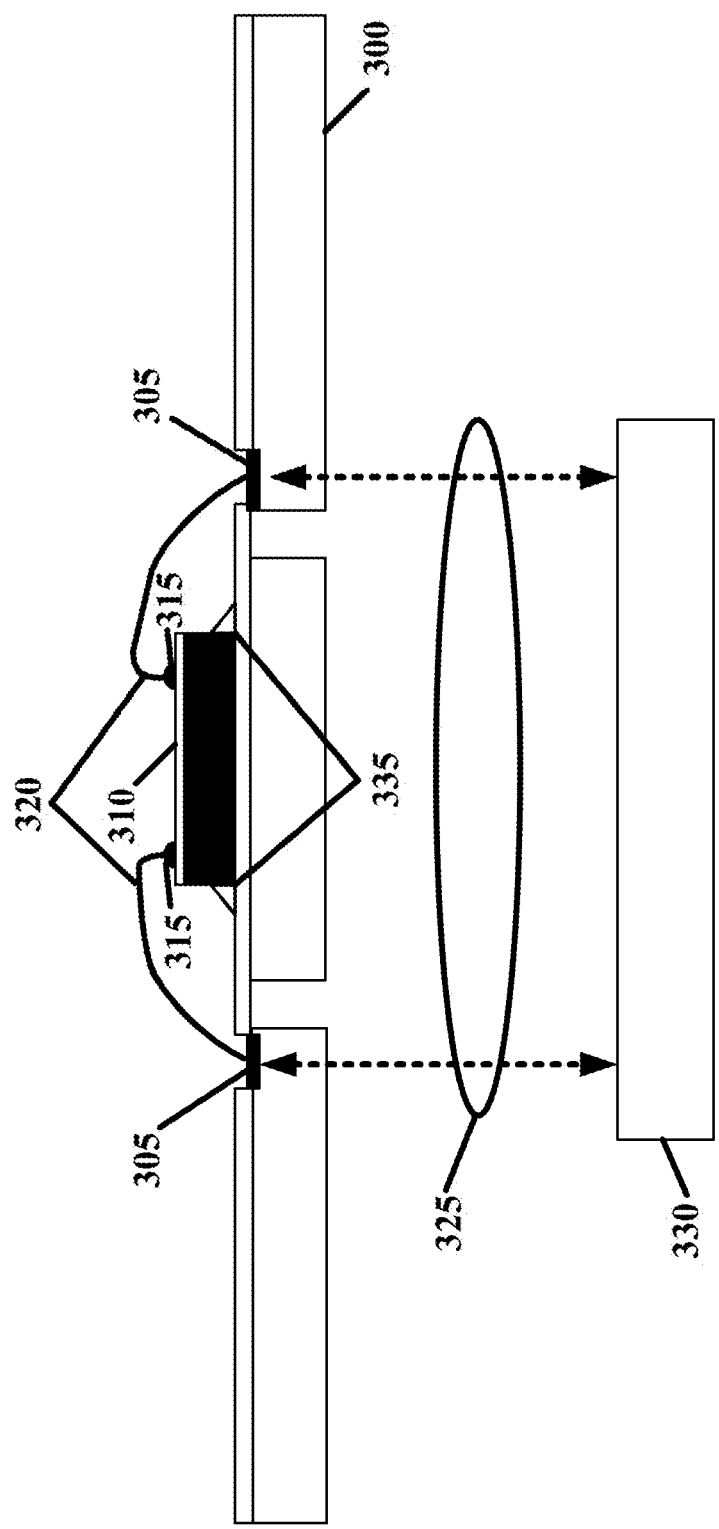
FIG. 3 shows an example implementation attachment of a lead frame with a differential signal path, consistent with various aspects of the present disclosure.

FIG. 3 shows an example implementation attachment of a lead frame with differential signal path, consistent with various aspects of the present disclosure. A lead frame 300 and is provided with fixed external pads 305, which are connected to an integrated circuit 310 at internal bond-pads 315 via bond wires 320. Additionally, the example implementation shown in FIG. 3 shows a differential signal path 325 that is characterized by bond-pad 315 pitch range, bond wire 320 length, and the bond wire 320 diameter. The differential signal path 325 carries signals in a frequency range between 5 GHz and 18 GHz, with less than approximately 25 dB differential return loss (DDRL). Also shown in FIG. 3 is a signal-processing node 330, electrically coupled to the differential signal path 325. By communicating the signals to or from the signal-processing node 330, signals can be processed at the signal-processing node 330 by using the differential signal path 325 to carry signals in a frequency range between 5 GHz and about 16 GHz. The integrated circuit 310 of lead frame 300 can be secured to the lead frame 300 utilizing adhesive 335.

Figure 4:
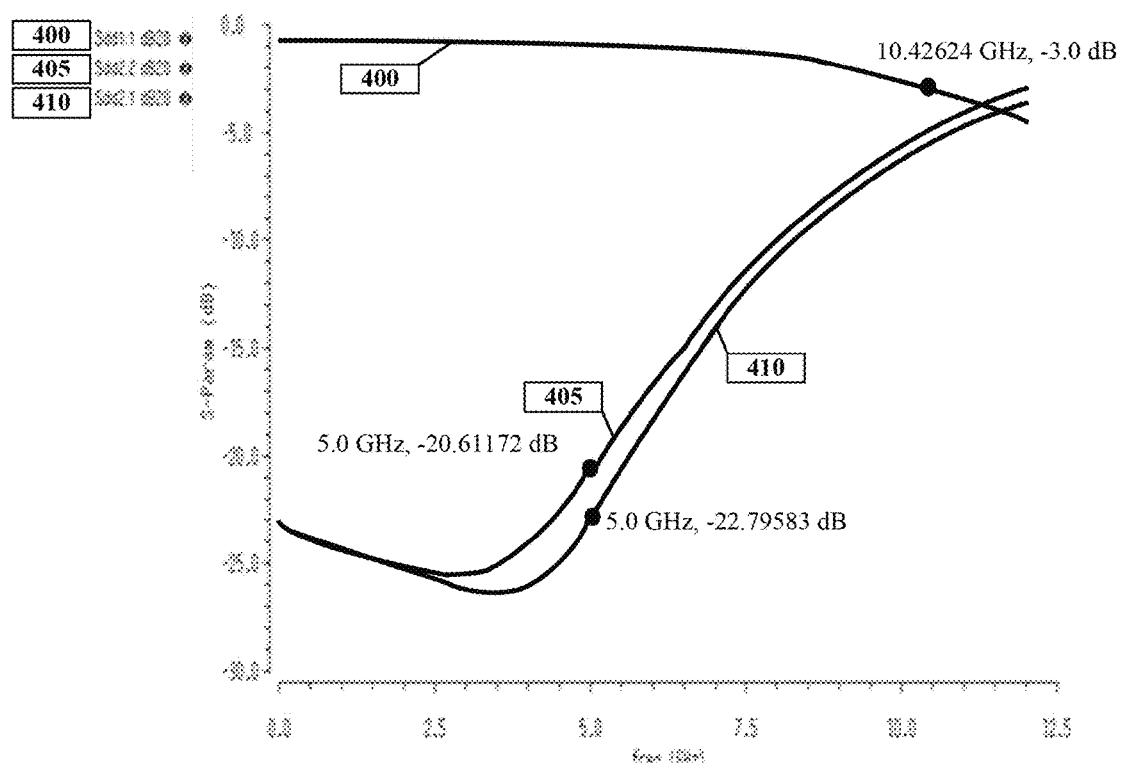
FIG. 4 shows an example circuitry simulation of a lead frame with a differential signal path, consistent with various aspects of the present disclosure.

FIG. 4 shows an example circuitry simulation of a lead frame with a differential signal path, consistent with various aspects of the present disclosure. FIG. 4 shows two different differential return loss (DDRL) return loss plots (405 and 410) of lead frame implementations of the present disclosure having a 20 µm diameter gold bond wire. The circuit simulations are carried out using the frequency bandwidth 400. As is shown in FIG. 4, the first implementation 405 and second implementation 410 demonstrate experimental differential return loss (DDRL) return loss that is less than 26 dB.

Figure 5:
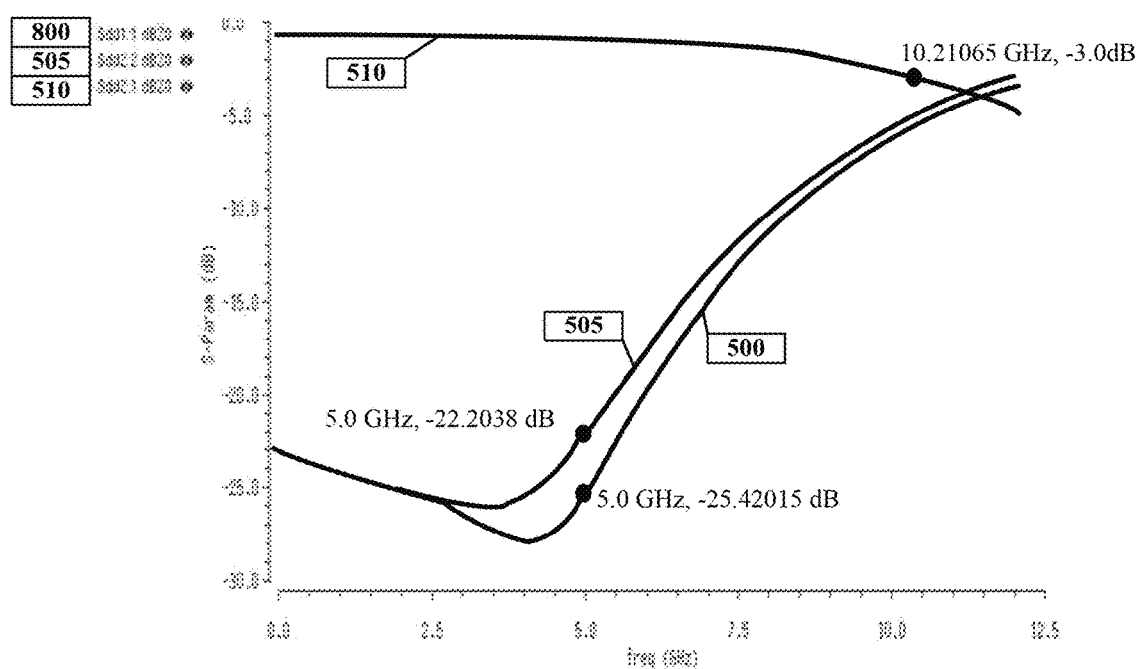
FIG. 5 shows another example circuitry simulation of a lead frame with a differential signal path, consistent with various aspects of the present disclosure.

FIG. 5 shows an example circuitry simulation of a lead frame with a differential signal path, consistent with various aspects of the present disclosure. FIG. 5 shows two different differential return loss (DDRL) return loss plots (505 and 510) of lead frame implementations of the present disclosure having an 18 µm diameter gold bond wire. The circuit simulations are carried out using the frequency bandwidth 500. As is shown in FIG. 4, the first implementation 505 and second implementation 510 demonstrate experimental differential return loss (DDRL) return loss that is less than 26 dB.

Table 1 shows various example experimental results of lead frame implementations, consistent with various aspects of the present disclosure. The various values of each of pad pitch, wire diameter, package pitch, and lay pitch, can be interchanged to form different desired implementations. Additionally, and as discussed above, various aspects of the present disclosure are directed toward decreasing the mutual inductance of the lead frame bond wires by increasing the self inductance of the individual bond wires, and the differential return loss is less than 26 dB. Such example results of the differential inductive loss (DDIL) and the differential return loss (DDRL) of the various lead frame implementations are also shown in Table 1.

TABLE 1

Example Experimental Results of Various Lead Frame Implementations

| Pad Pitch | Wire Diameter | Package Pitch | Lay Pitch | −3 dB | DDIL 5 GHz | DDRL 5 GHz |
|---|---|---|---|---|---|---|
| 60 µm | 18 µm | 120 µm | 60 µm | 9.3 | −1.02 | −14.3 |
| 60 µm | 18 µm | 180 µm | 60 µm | 9.3 | −1.03 | −14.2 |
| 60 µm | 20 µm | 60 µm | 60 µm | 8.5 | −1.3 | −13.1 |
| 90 µm | 18 µm | 90 µm | 90 µm | 10.5 | −1 | −16.1 |
| 120 µm | 18 µm | 120 µm | 120 µm | 9.8 | −1 | −16.1 |
| 180 µm | 18 µm | 180 µm | 180 µm | 9.7 | −1 | −15.9 |

For further discussion of differential return loss, as relating to the embodiments and specific applications discussed herein, reference may be made to the underlying provisional patent application to which priority is claimed, which is herein fully incorporated by reference.

Based upon the above discussion and illustrations, those skilled in the art will readily recognize that various modifications and changes may be made to the various embodiments without strictly following the exemplary embodiments and applications illustrated and described herein. Such modifications do not depart from the true spirit and scope of various aspects of the invention, including aspects set forth in the claims.

What is claimed is:

1. A method comprising:
   providing a lead frame for an integrated circuit, the lead frame configured to provide signal fan-out to nodes external to the integrated circuit and the nodes having a fixed external pin pitch;
   providing wires connecting bond pads of an integrated circuit chip to the lead frame, the wires and bond pads including:
      a differential signal path characterized by a bond-pad pitch, wire length and wire diameter, the differential signal path being configured and arranged to carry signals in a frequency range between 5 GHz and 16 GHz with less than about 25 dB differential return loss (DDRL); and
      a non-differential signal path characterized by a bond-pad pitch that is less than the bond-pad pitch of the differential signal path; and
   communicating signals to or from a signal-processing node that is electrically coupled to the differential signal path and by using the differential signal path to carry signals in a frequency range between 5 GHz and about 16 GHz.

2. The method of claim 1, wherein the bond-pad pitch for the differential signal path is between 60 µm and 180 µm.

3. The method of claim 1, wherein the bond-pad pitch of the differential signal path is between 60 µm and 180 µm, the wire length is less than approximately three centimeters, and the wire diameter is between 15 µm and 25 µm.

4. The method of claim 1, wherein the wire diameter is between 15 µm and 25 µm.

5. The method of claim 1, wherein the bond-pad pitch of the differential signal path, wire length and wire diameter are respectively 120 µm, approximately three centimeters, and 18 µm.

6. The method of claim 1, wherein the frequency range is greater than 5 GHz and less than 18 GHz.

7. The method of claim 1, wherein the frequency range is greater than 10 GHz and less than 16 GHz.

8. The method of claim 1, wherein the frequency range is 16.1 GHz.

9. The method of claim 1, wherein the fixed external pin pitch is between 90 µm and 180 µm.

10. A signal interface apparatus for a lead frame with a fixed external pin pitch, the apparatus comprising:
    a signal interface circuit including bond pads on an integrated circuit die and wires connecting the bond pads to the lead frame configured and arranged to provide a differential signal path characterized by a bond-pad pitch, wire length and wire diameter, and to carry signals in a frequency range between 5 GHz and 16 GHz with less than about 25 dB differential return loss (DDRL), and a non-differential signal path characterized by a bond-pad pitch that is less than the bond-pad pitch of the differential signal path; and
    a signal-communication circuit configured and arranged for communicating the signals to or from a signal-processing node that is electrically coupled to the differential signal path through pins of the lead frame and using the differential signal path to carry the signals in a frequency range between 5 GHz and about 16 GHz.

11. The signal interface apparatus of claim 10, wherein the signal-communication circuit is a signal-transceiver circuit configured and arranged to communicate the signals to and from the signal-processing node.

12. The signal interface apparatus of claim 10, wherein the bond-pad pitch of the differential signal path is between 60 µm and 180 µm, the wire length is less than approximately three centimeters, and the wire diameter is between 15 µm and 25 µm.

13. The signal interface apparatus of claim 10, wherein the bond-pad pitch of the differential signal path, wire length and wire diameter are respectively 120 µm, approximately three centimeters, and 18 µm.

14. The signal interface apparatus of claim 10, wherein the frequency range is greater than 5 GHz and less than 18 GHz.

15. The signal interface apparatus of claim 10, wherein the frequency range is greater than 10 GHz and less than 16 GHz.

16. The signal interface apparatus of claim 10, wherein the frequency range is 16.1 GHz.

17. The signal interface apparatus of claim 10, wherein the fixed external pin pitch is between 90 μm and 180 μm.

\* \* \* \* \*